United States Patent [19]

Frisina

[11] Patent Number: 4,916,085

[45] Date of Patent: Apr. 10, 1990

[54] MOS POWER STRUCTURE WITH PROTECTIVE DEVICE AGAINST OVERVOLTAGES AND MANUFACTURING PROCESS THEREFOR

[75] Inventor: Ferruccio Frisina, Catania, Italy

[73] Assignee: SGS Microelettronica S.p.A., Catania, Italy

[21] Appl. No.: 366,212

[22] Filed: Jun. 15, 1989

Related U.S. Application Data

[62] Division of Ser. No. 130,952, Dec. 9, 1987, abandoned.

[30] Foreign Application Priority Data

Dec. 17, 1986 [IT] Italy .............................. 22719 A/86

[51] Int. Cl.⁴ ........................................... H01L 21/283

[52] U.S. Cl. ........................................ 437/44; 437/31; 437/45; 437/59; 437/904; 357/23.13; 357/43

[58] Field of Search ................... 357/23.13, 23.4, 23.8, 357/43, 41, 13, 86; 437/31, 32, 33, 34, 41, 44, 45, 47, 51, 54, 55, 56, 57, 58, 59, 60

[56] References Cited

U.S. PATENT DOCUMENTS

| | | | |
|---|---|---|---|
| 4,686,551 | 8/1987 | Mihara | 357/13 |
| 4,688,323 | 8/1987 | Yoshida et al. | 357/23.13 |
| 4,721,686 | 1/1988 | Contiero et al. | 437/31 |
| 4,814,288 | 3/1989 | Kimura et al. | 437/59 |

FOREIGN PATENT DOCUMENTS

| | | | |
|---|---|---|---|
| 0065269 | 11/1982 | European Pat. Off. | 357/43 |
| 55-91171 | 7/1980 | Japan | 357/23.13 |
| 58-21374 | 2/1983 | Japan | 357/23.13 |

*Primary Examiner*—Brian E. Hearn
*Assistant Examiner*—T. N. Quach
*Attorney, Agent, or Firm*—Cushman, Darby & Cushman

[57] ABSTRACT

A MOS power structure made up of at least one MOS cell with gate electrode, drain electrode, source electrode, well-region and of a bi-polar parasitic transistor provided with a protective device for the gate and drain against overvoltages. The protective device consists of a further bi-polar transistor with optional addition of a zener diode.

2 Claims, 5 Drawing Sheets

3
N⁻
1
N⁺

12
P⁺
P⁺
P⁺
4
4
11
3
1

6
6
6
7
4
4
11
3
1

16
17
17
17
17
6
6
6
8
N+
P-
P-
P+
P+
P+
N+
N+
7
7
7
9
11
13
5
4
3
18
TT
M
20
DZ
15
N-
N+
2
1

3
TT
6
DZ
T
M
5

3
M
DV
6
DV
CES
DV
EBO
5

14
14
P+
15
3
N-
1
N+

MOS POWER STRUCTURE WITH PROTECTIVE DEVICE AGAINST OVERVOLTAGES AND MANUFACTURING PROCESS THEREFOR

This is a division of Application No. 07/130,952, filed Dec. 9, 1987, which was abandoned upon the filing hereof.

BACKGROUND OF THE INVENTION

The present invention relates to an MOS power structure equipped with a protective device against overvoltages together with the related manufacturing process.

An MOS power structure consists of one or more elementary MOS cells and a parasitic bipolar transistor transistor operating as a diode between the source and drain electrodes of the MOS cell.

It is known that structures of this type require adequate protection for the gate and drain electrodes. The need to protect the gate is the consequence of the fact that the structure is of the metal-oxide-semiconductor type and the voltage which said structure can withstand depends on the thickness of the oxide.

In the power MOS this thickness is very small, i.e. on the order of a few hundred angstroms, and hence the maximum voltage applicable is a few tens of volts. At higher voltages there is a discharge into the oxide with resulting destruction of the component. During dynamic operation there can however exist inlet voltage transients or peaks, depending on the application circuit, which exceed the breakdown voltage of the oxide.

Protection of the drain is necessary because when the component is working in commutation it is subjected simultaneously to high voltages and currents which during the extraction phase cause reverse secondary breakdown stresses and/or harmful volage transients.

SUMMARY OF THE INVENTION

The object of the present invention is to equip an MOS power structure with a simple but effective protective device for the gate and drain against overvoltages.

In accordance with the invention said object is achieved with an MOS power structure comprising at least one MOS cell with gate, drain and source electrodes, well region, a bipolar parasitic transistor and a protective device against overvoltages characterized in that said protective device comprises another bipolar transistor having emitter, collector and base connected to the gate, drain and source respectively of said MOS cell.

It has been observed that with this solution the gate is protected by the emitter-base voltage with open collector ($V_{EBO}$) of the added bipolar transistor while the drain is protected by the emitter-collector junction of said transistor in the $V_{CEX}$ configuration (collector-emitter voltage with base receiving any voltage different from zero).

In accordance with a variant of the invention intended to ensure a greater safety margin for protection of the drain, the protective device comprises in addition a zener diode placed between the drain and the source of the MOS cell. In this case protection of the drain is guaranteed by the zener diode, which operates as an overvoltage blocking diode.

BRIEF DESCRIPTION OF THE DRAWINGS

The two abovementioned solutions will now be described in detail with reference to the annexed drawings wherein.

DESCRIPTION OF THE PREFERRED EMBODIMENTS

Figure 1:
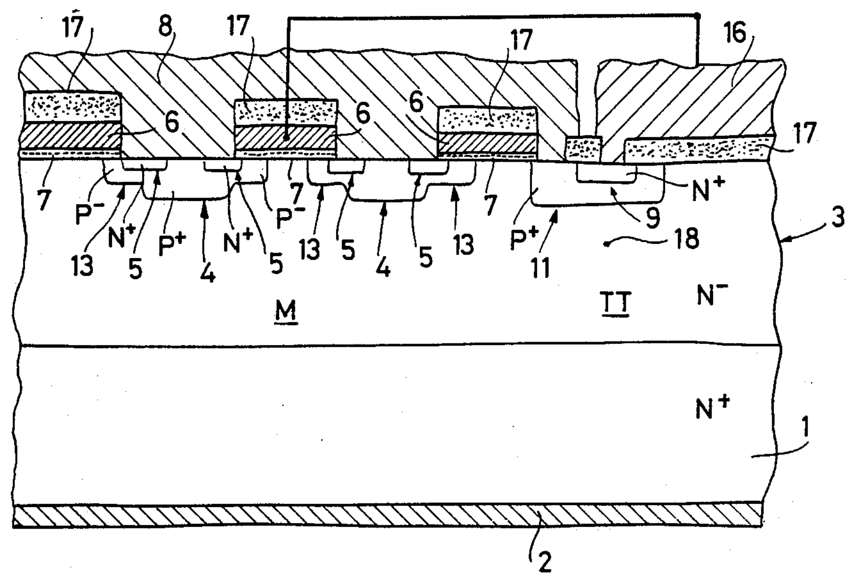
FIG. 1 shows an MOS power structure in accordance with the invention provided with a single-structure protective device consisting of a bipolar transistor.

The MOS power structure illustrated in FIG. 1 comprises a group of MOS cells formed of an $N^+$ substrate 1 bearing a drain metalization 2, an $N^-$ epitaxial layer drain 3 provided with doped areas $P^+$ 4 and $N^+$ 5 forming the well and source areas respectively, a gate layer 6 surrounded by dielectric oxide 7–17, and finally a source metalization 8 which short circuits the abovementioned well and source areas 4 and 5.

One feature of a power MOS like that described above is that the flow of current going from the source to the drain is vertical. This configuration creates a parasitic bipolar transistor which has its base coinciding with the well 4 of the MOS cell, the emitter coinciding with the source 5 of said cell and finally the collector coinciding with the drain 3. In said transistor the base and the emitter are short-circuited by the source metalization 8 and the base has a high concentration through the $P^+$ zone 4. The transistor is thus always in the $V_{CES}$ configuration (collector-emitter voltage with short-circuited base) and behaves as a diode.

Figure 2:
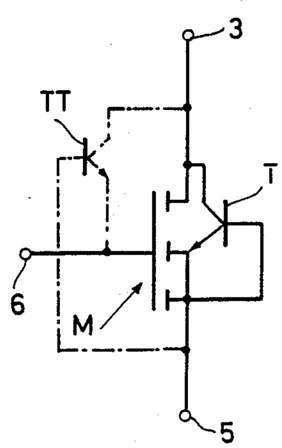
FIGS. 2 and 3 show the electrical diagram and the equivalent electrical diagram respectively of the structure shown in FIG. 1, FIGS. 4–8 show in succession several phases of the manufacturing process of the structure shown in FIG. 1.

The electrical circuit corresponding to the circuit described is illustrated in FIG. 2 where M indicates the MOS cell and T indicates the parasitic transistor. The related equivalent circuit is illustrated in FIG. 3 where M indicates again the MOS cell and $DV_{CES}$ indicates the diode in $V_{CES}$ configuration equivalent to the transistor T. The reference M is also used in FIG. 1 to indicate the part related to the MOS cell, also intended to include the parasitic transistor T.

With the abovedescribed MOS structure is associated in accordance with the invention a protective device for the gate and drain which in the example shown in FIG. 1 consists of another bipolar transistor TT created beside the MOS cell with the collector made up of a part 18 of the drain area 3, the emitter consisting of an $N^+$ doping area 9 connected through a metalization 16 to the gate 6 of the MOS cell and the base consisting of a $P^+$ doping area 11 connected to the source 5 through the source metalization 8. The abovementioned connections of the protective transistor TT are illustrated in dash-and-dot lines in the electrical diagram shown in FIG. 2.

Figure 3:
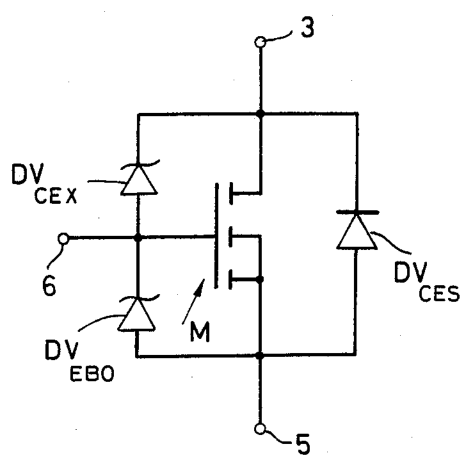

With this solution the gate 6 of the MOS structure is protected by the $V_{EBO}$ voltage (emitter-base voltage with open collector) of the bipolar transistor TT which for this purpose operates as a zener diode $DV_{EBO}$ placed between the gate and the source of the MOS cell as illustrated in the equivalent circuit shown in FIG. 3. In this manner the gate 6 will never be subjected to voltages greater than the base-emitter breakdown voltage of the transistor TT.

The drain 3 is projected by the emitter-collector junction of said transistor TT in $V_{CEX}$ configuration (collector-emitter voltage with base receiving any voltage different form zero) as represented by the zener diode $DV_{CEX}$ in the equivalent circuit shown in FIG. 3. The protection is due to the fact that once the $V_{CEX}$ has been selected for the protective transistor TT less than the $V_{CES}$ of the parasitic transistor T, it is the collector-emitter junction of the former which breaks down before the latter.

Figure 4:
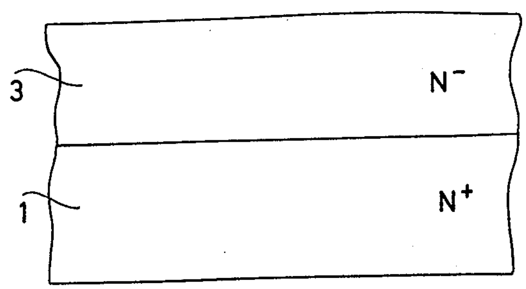
Figure 5:
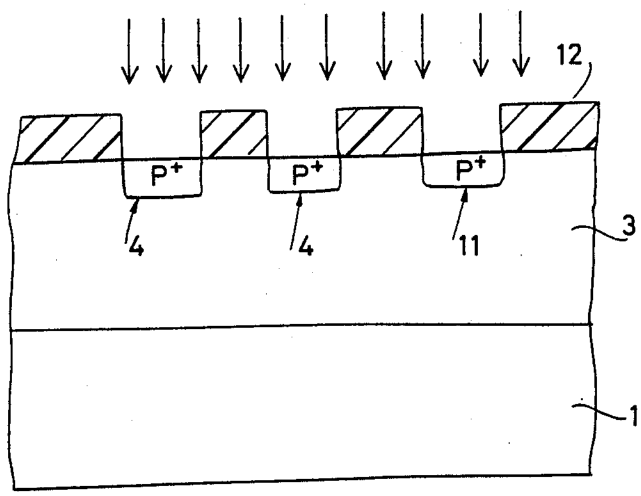

An example of the production process of the MOS structure shown in FIG. 1 is illustrated in FIGS. 4–8. The starting material consists of a substrate 1 of highly $N^+$ doped (from $10^{18}$ to $10^{20}$ atoms/cm$^3$) Si (100) on which is epitaxially grown a slightly $N^-$ doped layer 3 (FIG. 4). The concentration and thickness of said layer 3 depend on the breakdown voltage of the component. For voltages of between 50 V and 1000 V resistivity varies from 1 to 50 ohm/cm and thickness from 5 to 80 micron.

On the epitaxial layer 3 after oxidation 12 by application of appropriate masking and photoengraving techniques the $P^+$ well region 4 of the MOS cell and the base 11 of the protective transistor TT (FIG. 5) are formed simultaneously. This is secured by an appropriate boron implantation (from $10^{14}$ to $10^{15}$ atoms/cm$^2$) and the depth of the implanted areas is only a few microns.

Figure 6:
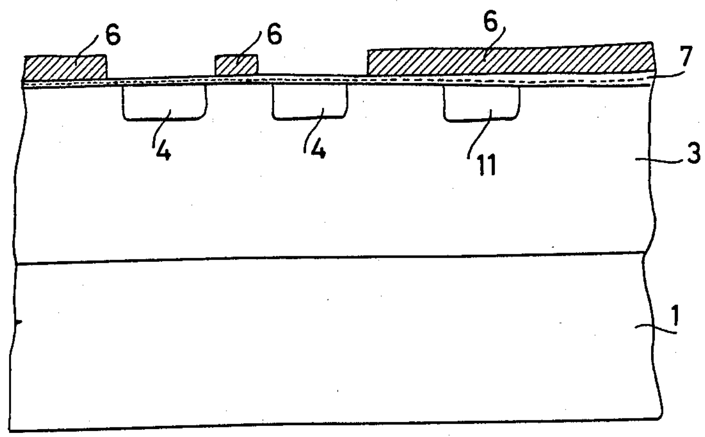
Figure 7:
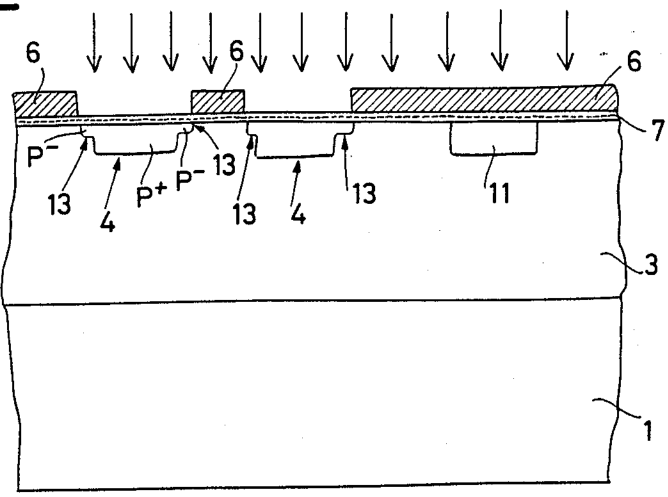

After a first deposition of oxide 7, the gate of the MOS cell is created by depositing a layer of polysilicon 6 which is then removed from the zones other than the gate zones (FIG. 6). The polysilicon layer 6 serves later as a mask for a further implantation of $P^-$ boron 13 which serves to control the threshold of the MOS cell (FIG. 7).

Figure 8:
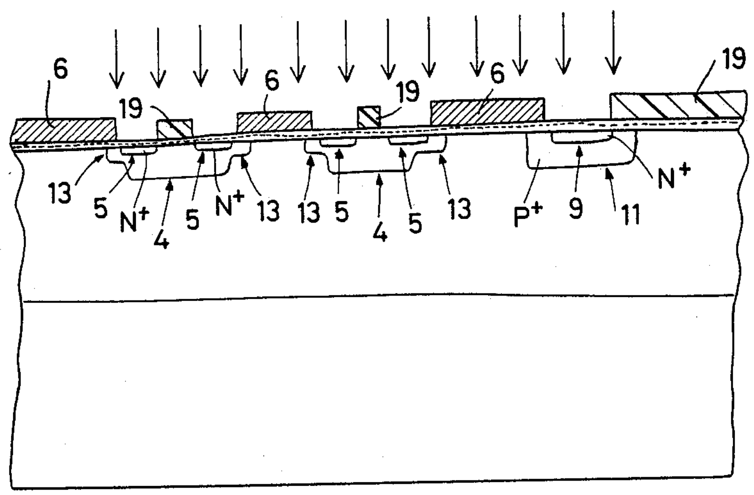

The source 5 of the MOS cell is created by means of another $N^+$ implantation (from $10^{15}$ to $10^{16}$ atoms/cm$^2$) with mask 19 which simultaneously creates th emitter 9 of the protective transistor TT (FIG. 8). The depth of said implantation is approximately 1 micron. In addition to the polysilicon 6 another mask 19 is used for this purpose.

When the dielectric oxide 17 is then superimposed, the structure is practically finished. It only remains to form the appropriate electrical connections. Specifically, after opening of the contacts (not shown) the source 5 of the MOS cell is connected to the base 11 of the transistor TT and the gate 6 of the MOS cell is connected to the emitter 9 of the transistor TT through appropriate metalizations 16 and 8 (FIG. 1).

Figure 9:
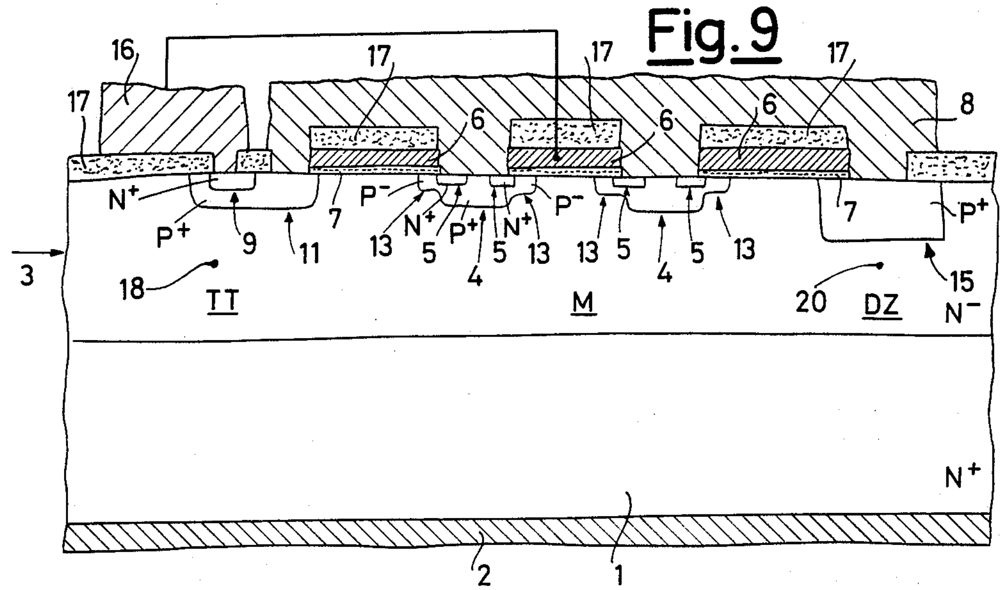
FIG. 9 shows another MOS power structure in accordance with the invention this time with a protective device having an independent structure consisting of a bipolar transistor and a zener diode.
Figure 10:
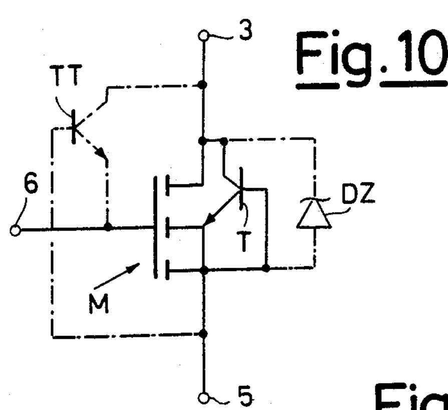
FIGS. 10 and 11 show the electrical diagram and the equivalent electrical diagram respectively of the structure shown in FIG. 9, and FIGS. 12–14 show in succession several steps in the manufacturing process of the structure shown in FIG. 9.
Figure 11:
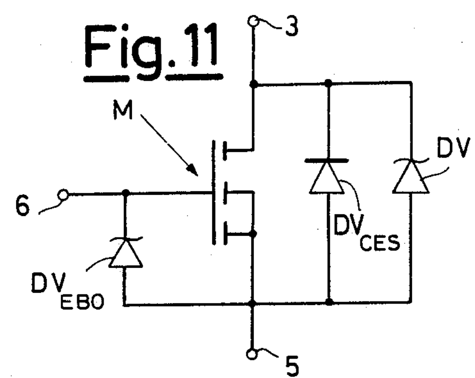

The structure illustrated in FIG. 9 is indistinguishable from that of FIG. 1 as for as the MOS cell M and the parasitic transistor T are concerned. In this case, however, the protective device for the gate and drain includes not only the bipolar transistor TT but also a zener diode DZ placed between the drain and the source of the MOS cell (FIG. 10) and formed of a part 20 of the drain area 3 and of a deeply diffused $P^+$ doped area 15 in electrical contact with the source metalization 8 (FIG. 9). The diffusion depth is selected in such a manner that the breakdown voltage DV of the zener diode DZ indicated in the equivalent circuit of FIG. 11 is just less than that of the MOS cell and the transistor TT so that the zener diode DZ operates as a true blocking diode.

With this solution the gate of the MOS cell is still protected by the $VL_{EBO}$ of the bipolar transistor TT. In this manner the gate will never be subjected to voltages greater than the base-emitter breakdown voltage of the transistor TT.

The drain is protected by the diode DZ, which is selected in such a manner as to have a breakdown voltage just below that of the MOS cell and the transistor TT.

This solution is preferable to the preceding one, which is however simpler, for the sake of safer protection of the drain, which can be set at will by appropriate selection of the $P^+$ diffusion depth 15 of FIG. 9.

Figure 12:
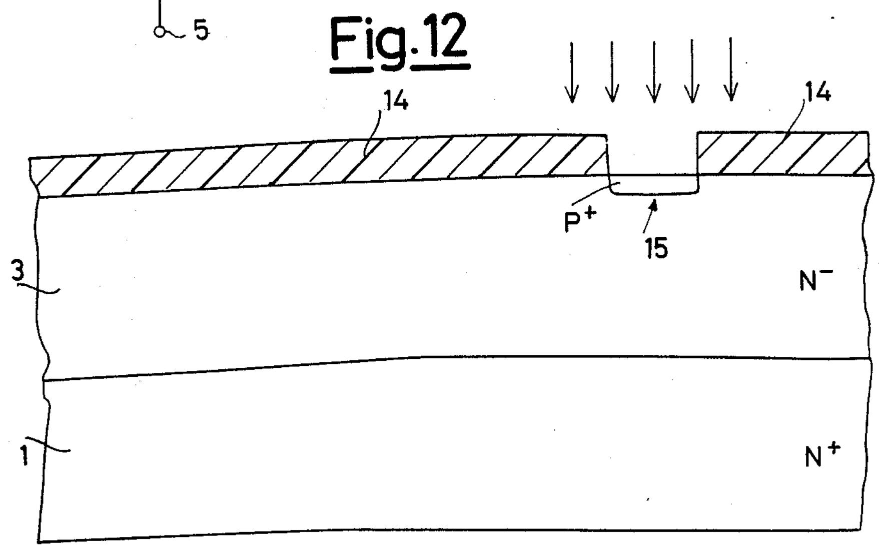
Figure 13:
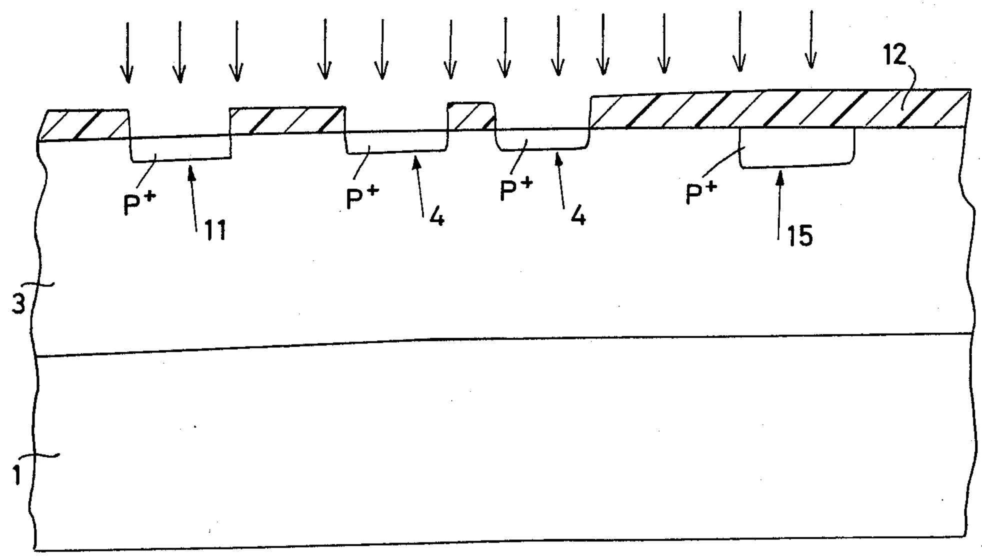
Figure 14:
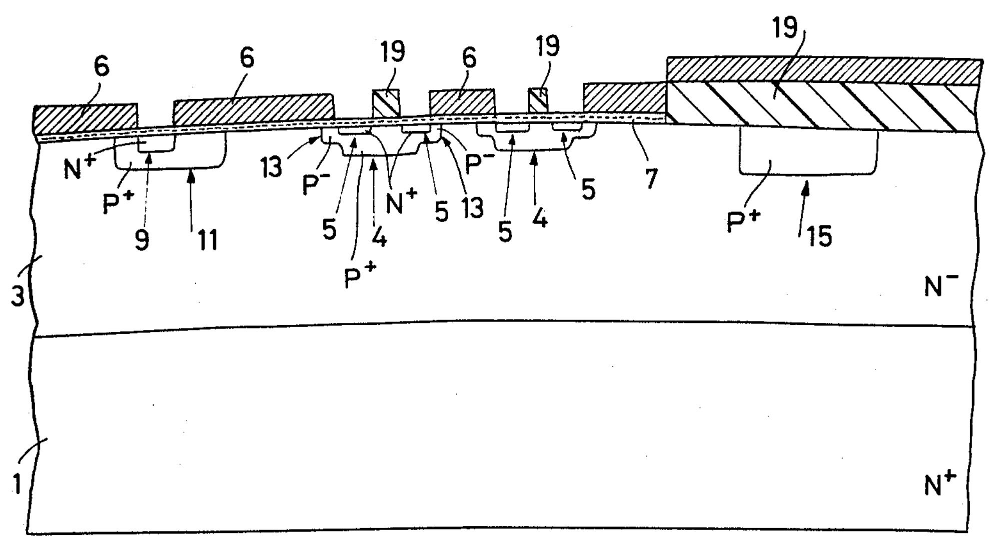

The manufacturing process of the MOS structure of FIG. 9 is illustrated as an example in FIGS. 12–14. It is not very different from that of FIGS. 4–18.

On an $N^+$ substrate 1 is grown a slightly $N^-$ doped epitaxial layer 3. Thereon is created after oxidation 14 the $P^+$ zone 15 of the DZ diode. It is formed by boron implantation (from $10^{13}$ to $10^{14}$ atoms/cm$^2$) masking all the remaining surface area (FIG. 12). In this step, by means of $P^+$ diffusion it is possible to control the depth of the PN junction of the diode DZ which, however, is only a few microns.

After creating the diode DZ and after having determined the junction depth, there is grafted the process described above starting from FIG. 5. The structure shown in FIG. 13 is thus obtained.

Then by the first described process the gate and source of the MOS cell are made, thus achieving the structure shown in FIG. 14.

At this point the protective transistor TT, the MOS cell and the diode DZ have been created. The junction depth of the diode DZ ($P^+N^-$) is however greater than that of the base-collector junction of the transistor TT and of the well-region-drain junction of the MOS cell. This is because the junction of the diode DZ has been subjected to an additional diffusion step (FIG. 12). It is just this diffusion time which determines and controls the difference between the two depths. In this manner the breakdown voltage of the diode DZ is surely less than that of the well-region-drain junction of the MOS cell and of the base-collector junction of the transistor TT.

At this point the contacts and metalizations can be created.

I claim:

1. A method of fabricating a MOS power structure comprising the steps of:

(a) forming a $N^-$-doped epitaxial layer on a $N^+$-doped semiconductor substrate;

(b) forming an oxide layer on the epitaxial layer;

(c) patterning the oxide layer to form windows corresponding to the well regions of MOS cells and the base region of a bipolar transistor protection structure;

(d) implanting acceptor impurities through the patterned oxide layer to simultaneously form the $p^+$-well regions and the $p^+$-base region;

(e) depositing a gate oxide layer on the entire surface of the epitaxial layer;

(f) depositing a polysilicon gate electrode layer on the oxide layer;

(g) patterning the polysilicon layer to form gate electrode regions for the MOS cells;

(h) implanting acceptor impurities into the epitaxial layer using the gate electrode regions as a mask to form the p−-channel regions which control the threshold of the MOS cell;

(i) forming a second oxide pattern corresponding to the source regions of the MOS cells and the emitter region of the protection device;

(j) implanting donor impurities into the p+-well regions and the p+-base region of the protection device to simultaneously form the N+-source regions of the MOS cells and the N+-emitter region of the bipolar protection device;

(k) forming a third oxide pattern corresponding to ohmic contacts; and (l) depositing a metallization layer connecting between the source electrode and the well region of each MOS cell and the base region of the protection transistor and a metallization layer connecting the gate of the MOS cell to the emitter region of the protection transistor.

2. A method of fabricating a MOS power structure comprising the steps of:

(a) forming a N−-doped epitaxial layer on a N+-doped semiconductor substrate;

(b) forming an oxide layer on the epitaxial layer;

(c) patterning the oxide layer to form a window corresponding to the anode region of a zener diode;

(d) implanting acceptor impurities through the patterned oxide layer to form the p+-anode region of the zener diode at a specified depth;

(e) forming and patterning a second oxide layer to establish windows corresponding to the well regions of MOS cells and the base region of a bipolar transistor protection structure;

(f) implanting acceptor impurities through the patterned oxide layer to simultaneously form the p+-well regions and the p+-base region in the epitaxial layer;

(g) depositing a gate oxide layer on the entire surface of the epitaxial layer;

(h) depositing a polysilicon gate electrode layer on the oxide layer;

(i) patterning the polysilicon layer to form gate electrode regions for the MOS cells;

(j) implanting acceptor impurities into the epitaxial layer using the gate electrode regions as a mask to form the p−-channel regions which control the threshold of the MOS cells;

(k) forming a third oxide pattern corresponding to the source regions of the MOS cells and the emitter region of the bipolar transistor protection structure;

(l) implanting donor impurities into the p+-well regions and the p+-base region of the bipolar protection device to simultaneously form the N+-source regions of the MOS cells and the N+-emitter region of the bipolar transistor protection structure;

(m) forming a fourth oxide pattern corresponding to ohmic contacts; and (n) depositing a metallization layer connecting between the source electrode and the well region of each MOS cell and the base region of the protection transistor as well as the anode region of the zener diode and a metallization layer connecting the gate of the MOS cell to the emitter region of the bipolar transistor protection structure.

* * * * *